United States Patent
Hwang et al.

(10) Patent No.: US 6,259,284 B1
(45) Date of Patent: Jul. 10, 2001

(54) CHARGE FREE POWER-ON-RESET CIRCUIT

(75) Inventors: Changku Hwang, Palo Alto, CA (US); Hiroyuki Mizuno; Masayuki Miyazaki, both of Tokyo (JP)

(73) Assignee: Hitachi America, Ltd., Tarrytown, NY (US)

( * ) Notice: Subject to any disclaimer, the term of this patent is extended or adjusted under 35 U.S.C. 154(b) by 0 days.

(21) Appl. No.: 09/470,256

(22) Filed: Dec. 22, 1999

(51) Int. Cl.[7] ........................................ H03L 7/00
(52) U.S. Cl. ..................... 327/142; 327/143; 327/198
(58) Field of Search ........................... 327/142, 143, 327/198, 268, 283, 290, 392, 393, 394, 395, 399

(56) References Cited

U.S. PATENT DOCUMENTS

| | | | |
|---|---|---|---|
| 4,716,322 | * 12/1987 | D'Arrigo et al. | 327/143 |
| 4,797,584 | * 1/1989 | Aguti | 327/143 |
| 5,321,317 | * 6/1994 | Pascucci et al. | 327/143 |
| 5,612,641 | * 3/1997 | Sali | 327/143 |
| 5,828,251 | * 10/1998 | Freyman et al. | 327/143 |
| 5,898,327 | 4/1999 | Tanaka | 327/143 |
| 5,999,039 | * 12/1999 | Holst et al. | 327/532 |

FOREIGN PATENT DOCUMENTS

| | | |
|---|---|---|
| 05014158A | 1/1993 | (JP) . |
| 11145808A | 5/1999 | (JP) . |

OTHER PUBLICATIONS

Clements, Alan, *Microprocessor System Design: 68000 Hardware, Software and Interfacing*, 1992, 2nd ed., PWS–Kent Publishing Company, pp. 147–162.

* cited by examiner

Primary Examiner—Kenneth B. Wells
Assistant Examiner—Paul Dinh
(74) Attorney, Agent, or Firm—Steven F. Caserza, Esq.; Flehr Hohbach Test Albritton & Herbert LLP

(57) ABSTRACT

A novel structure and method are taught for fully discharging a capacitor and thereby reducing the capacitance needed to achieve a desired RC time constant. The invention overcomes the previously encountered problem of using a large and area-inefficient capacitor. The invention allows for conservation of integrated circuit space and is cost effective.

9 Claims, 2 Drawing Sheets

CHARGE FREE POWER-ON-RESET CIRCUIT

FIELD

The invention relates to a CMOS integrated circuit, more particularly, a time delay circuit including a voltage discharging circuit which allows a capacitor to be more fully discharged, thereby reducing the capacitance needed to achieve a desired RC time constant.

BACKGROUND

In complementary metal oxide silicon (CMOS) structures a well known parasitic effect occurs between a pair of cross-coupled parasitic pnp and npn bipolar transistors which form a positive feedback path. The current gain in the two transistors can reach a point in which a circuit is easily triggered by an external disturbance such that it creates a regenerative condition and the transistors are driven by each other. The current in both transistors can increase until they self limit or until they lead to the destruction of an integrated circuit. This condition, known as latch-up, can occur when a back bias generator is contained in an integrated circuit and the integrated circuit is powered on. During power-on, the back bias generator voltages are not clearly defined, the well regions are not biased to the correct levels, and hence under such conditions latch-up is likely to occur. The back bias generator is useful, however, during integrated circuit standby mode when it reduces the transistor subthreshold current by applying a bias voltage to the well regions to establish greater threshold voltages than during the active mode of operation. For example, in modem deep sub-micron process technology, MOS transistor threshold voltage is usually in the range of 0.25 volts to 0.4 volts. With such threshold voltage and leakage worst operating condition (e.g., high temperature and fast process comer), transistor drain leakage at its off state can occur in the range of several tens of nano-amperes per unit size. The total leakage can increase to a problematic level, especially in battery-powered applications, with the use of many transistors (i.e., for an integrated circuit such as microprocessor, the total leakage of hundreds of mA can occur). Therefore, the back bias generator is used to bias the well regions to increase the threshold voltage, significantly reducing transistor leakage during standby mode.

It is common practice to use a resistor 11 and a capacitor 12 in series, as shown in FIG. 1a, to provide an RC time constant which determines the amount of time required to reach a desired capacitor voltage on output terminal 13 from an applied source voltage on line 14. This type of resistor-capacitor (RC) circuit 10 is used to disable the back bias generator and force the integrated circuit into the active mode when the integrated circuit is initially powered on (i.e., "power on reset"). Capacitor 12 charges through resistor 11 when VDD is applied to the integrated circuit and discharges through resistor 11 when VDD is removed. RC circuit 10 provides an output terminal 13, a power-on-reset control signal according to the voltage versus time characteristics as shown in FIG. 1b. The problem with this prior art circuit is that a high value multi-mega ohm resistor 11 is necessary to obtain the desired RC time constant. This type of resistor is often unavailable in many types of fabrication processes.

A second prior art circuit widely used but still having shortcomings that are overcome by the present invention is shown in FIG. 2a. Here, PMOS transistor 21, having a long and thus highly resistive channel, is used in place of high resistance resistor 11 of FIG. 1a. When VDD is applied to lead 24, P channel transistor 21 turns on, charging capacitor 22, providing the power-on-reset signal shown in FIG. 2b. When VDD is removed from lead 24, capacitor 22 discharges to lead 24 through transistor 21 (now the drain and source reversed) and the PN junction formed between drain 21c and the well region of transistor 21. However, the discharging of capacitor though the PN junction stops when the voltage on capacitor 22 drops below the diode turn-on voltage and the discharging of capacitor 22 through transistor 21 stops when the voltage on capacitor 22 drops below threshold voltage of transistor 21. This is shown in the diagram of FIG. 2b. When VDD is switched on and the voltage on capacitor 22 is not zero, capacitor 22 charging time is severely decreased. Thus, the capacitance of capacitor 22 must be significantly increased to assure the desired RC time constant to provide an appropriate time period upon power-on-reset during which the back bias generator is disabled and the integrated circuit is placed in the active mode, thereby preventing latch-up. To assure the desired RC time constant using this circuit which provides the power-on-reset signal on output terminal 23, a large capacitance is needed. However, using a large capacitor increases the integrated circuit area and is thus expensive.

SUMMARY

In accordance with the teachings of this invention a novel structure and method are taught for fully discharging a capacitor and thereby reducing the capacitance needed to achieve a desired RC time constant. The invention overcomes the previously encountered problem of using a large and area-inefficient capacitor. The invention allows for conservation of integrated circuit space and is cost effective.

DETAILED DESCRIPTION

Figure 1A:
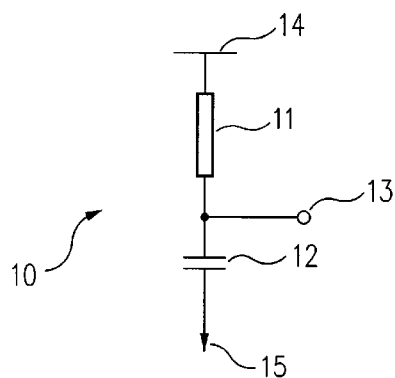
FIG. 1a is a schematic diagram depicting a prior art RC type circuit.
Figure 1B:
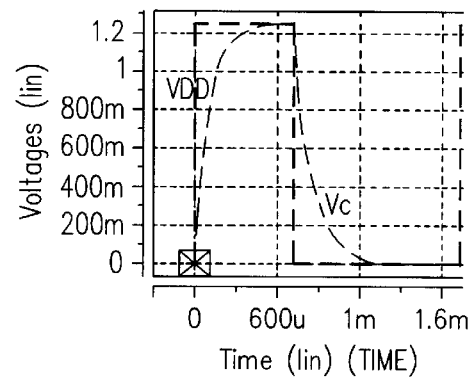
FIG. 1b is a timing diagram depicting the prior art RC type circuit capacitor response to applied voltage over time.
Figure 2A:
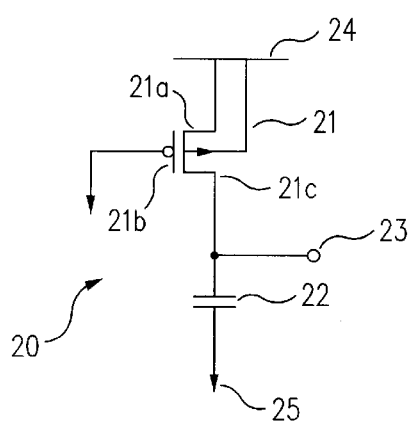
FIG. 2a is a schematic diagram depicting a prior art PMOS-C type circuit.
Figure 2B:
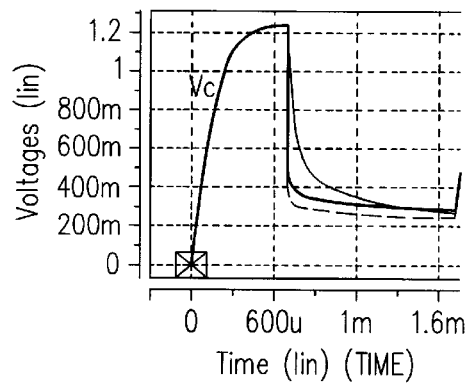
FIG. 2b is a timing diagram depicting the prior art PMOS-C type circuit capacitor response to applied voltage over time.
Figure 3A:
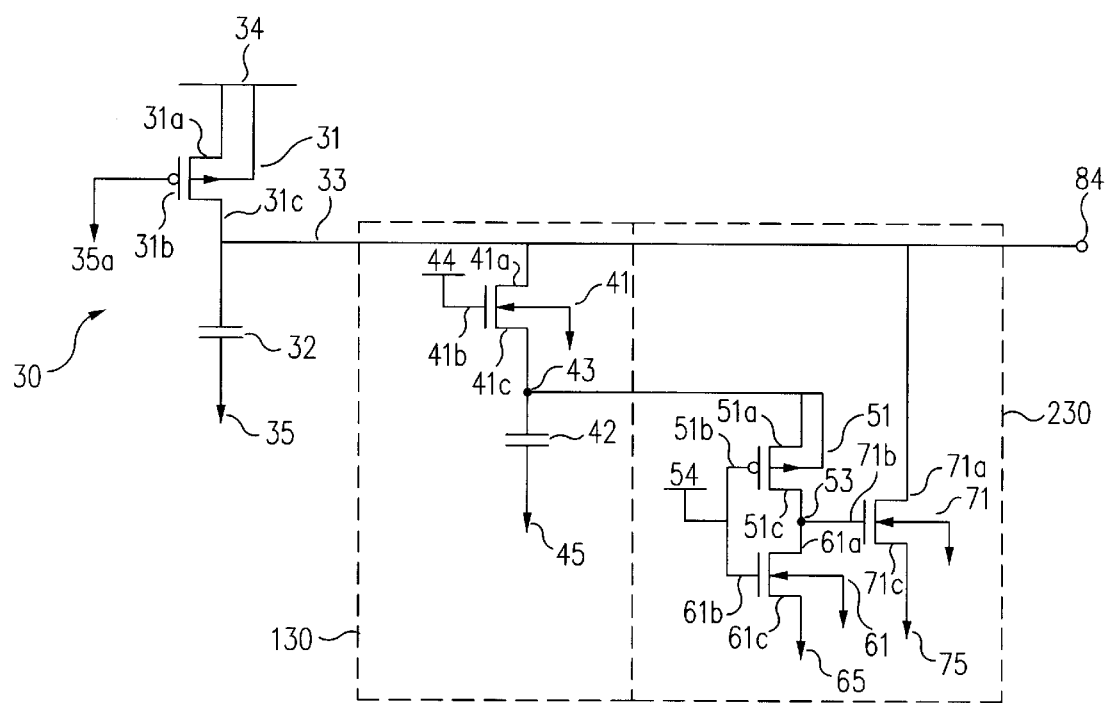
FIG. 3a is a schematic diagram depicting one embodiment of the present invention PMOS-C type circuit.

FIG. 3a depicts one embodiment of the present invention which provides a desired RC time constant with small integrated circuit area requirements. This is achieved by including circuitry which assures capacitor 33 is promptly and fully discharged in the absence of VDD. The additional circuitry which performs this function takes up less circuit area than does the increased size of capacitor 22 of the prior art circuit of FIG. 2a. This includes voltage storage circuit 130 for storing charge for use when VDD is removed from the circuit 30, and voltage discharge circuit 230 for fully discharging capacitor 32.

Prior to the integrated circuit power supply voltage VDD being turned on, capacitors 32 and 42 are fully discharged. When VDD is turned on at terminal 34, terminal 44, and terminal 54, P channel transistor 31, having a long, highly resistive channel turns on. Therefore, terminal 34 charges capacitor 32, and the voltage at node 33 reaches VDD at a time consistent with the selected RC time constant, providing the desired power-on-reset signal on output terminal 84. Prior to the power-on-reset signal on output terminal 84 going high, a desired period of delay is provided during which the integrated circuit is forced to be in the active mode, the back bias generator is disabled, and latch up is prevented.

Figure 3B:
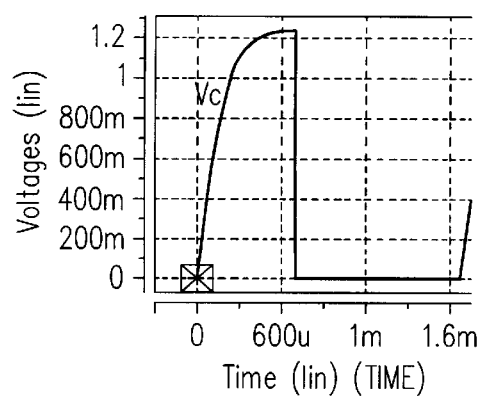
FIG. 3b is a timing circuit depicting one embodiment of the present invention PMOS-C type circuit capacitor 32 response to applied voltage over time.

As capacitor 32 charges, N channel transistor 41, having its gate 41b connected to VDD on terminal 44, turns on. This causes transistor 31 to charge not only capacitor 32, but capacitor 42 as well. As capacitor 42 charges, the voltage at node 43 reaches VDD. P channel transistor 51, having its gate 51b is connected to VDD at terminal 54, remains off. N channel transistor 61, having its gate 61b is connected to VDD at terminal 54, turns on. Transistor 61 thus connects node 53 to ground 65, keeping N channel transistor 71 turned off. The power-on-reset signal on output terminal 84 rises, as shown in FIG. 3b.

When VDD is turned off, transistor 41 is turned off. Transistor 31 and the forward biased PN diode formed between drain 31c and the well region of transistor 31 cause capacitor 32 to discharge to terminal 34 until node 33 reaches the level of the smaller value of the diode turn-on voltage (approximately 0.6 volts) and threshold voltage of transistor 31 (typically 0.3 volts, but it varies depending on temperature and fabrication). At the same time P channel transistor 51, with its gate 51b now low and its source high from the charge on capacitor 42, is turned on, connecting capacitor 42 to node 53. At this time N channel transistor 61, with its gate now low, is off. Node 53 is high, being powered by capacitor 42 with node 43 high, through transistor 51. N channel transistor 71 is turned on, additionally discharging capacitor 32 through transistor 71 to ground 75, fully discharging capacitor 32. This provides a rapid and complete discharge of capacitor 32, as shown in FIG. 3b.

When VDD is again switched on, P channel transistor 51 is turned off, N channel transistor 61 is turned on, and node 53 is pulled low. This in turn causes N channel transistor 71 to turn off, preventing further discharge of capacitor 32. Transistor 31 is turned on, charging capacitor 32 with the desired RC time constant, since capacitor 32 was previously fully discharged by transistor 71. Transistor 41 is turned on and any remaining charge on capacitor 42 is shared with capacitor 32. As long as the ratio of the capacitances of capacitor 32 to capacitor 42 is large, the voltage at node 33 is not substantially increased by this charge sharing from capacitor 42 and it is predictable value regardless of operating and fabrication condition, and the decrease in capacitor 32 charging time in the event capacitor 42 was not fully discharged is not significant, and thus the RC time constant is not significantly changed.

In one embodiment of this invention, the area ratio of capacitor 42 to capacitor 32 is approximately 0.05. In this embodiment, capacitor 32 is sized to provide a capacitance of only 100 pF, as compared with capacitor 22 of prior art FIG. 2a having a capacitance of 250 pF, with a resultant area savings of 60%. The area required to include capacitor 42 and transistors 41, 51, 61, and 71 is only about 7% of the area required for capacitor 32, resulting in an area savings of approximately 57.2% for circuit 30 as a whole, as compared with prior art circuit 20 of FIG. 2a.

The invention now being fully described, it will be apparent to one of ordinary skill in the art that many changes and modifications can be made thereto without departing from the spirit or scope of the appended claims.

What is claimed is:

1. A circuit to provide a desired RC time constant comprising:
   a power terminal for connection to a power supply;
   a first transistor coupled to said power terminal;
   a first capacitor coupled to said first transistor;
   a voltage storage circuit configured to receive power from said power terminal; and
   a voltage discharging circuit powered by said voltage storage device, and configured to discharge voltage from said first capacitor, said voltage discharging circuit comprising:
      a third transistor, having a first current handling terminal coupled to said second transistor, a control terminal coupled to a bias voltage, and a second current handling terminal;
      a fourth transistor, having a first current handling terminal coupled to said third transistor, a control terminal coupled to a bias voltage, and a second current handling terminal coupled a bias voltage; and
      a fifth transistor, having a first current handling terminal coupled to a first plate of said first capacitor, a control terminal coupled to said third transistor and said fourth transistor, and a second current handling terminal coupled to a second plate of said first capacitor.

2. The circuit as in claim 1, said first transistor having a first current handling terminal coupled to said power terminal, a control terminal coupled to a bias voltage, and a second current handling terminal coupled to said first capacitor.

3. The circuit as in claim 2, said first transistor having a first state and a second state, said first state routing current from said first current handling terminal to said second current handling terminal, said second state routing current from said second current handling terminal to said first current handling terminal.

4. The circuit as in claim 1, said voltage storage circuit comprising:
   a second transistor, having a first current handling terminal coupled to said first transistor, a control terminal coupled to a bias voltage, and a second current handling terminal; and
   a second capacitor coupled to said second current handling terminal of said second transistor.

5. The circuit as in claim 4, said second transistor having a first state and a second state, said first state routing current from said first current handling terminal to said second current handling terminal, said second state being a nonconductive state.

6. The circuit as in claim 1, said third transistor having a first state and a second state, said first state being a nonconductive state, said second state routing current from said first current handling terminal to said second current handling terminal.

7. The circuit as in claim 1, said fourth transistor having a first state and a second state, said first state routing current from said first current handling terminal to said second current handling terminal, said second state being a nonconductive state.

8. The circuit as in claim 1, said fifth transistor having a first state and a second state, said first state being a nonconductive state, said second state routing current from said first current handling terminal to said second current handling terminal.

9. The circuit as in claim 1 wherein said first transistor comprises a high resistive channel.

* * * * *